US012688887B2

(12) United States Patent
Disegni et al.

(10) Patent No.: US 12,688,887 B2
(45) Date of Patent: Jul. 21, 2026

(54) PROGRAMMING FOR NON-VOLATILE MEMORY

(71) Applicant: STMicroelectronics International N.V., Geneva (CH)

(72) Inventors: Fabio Enrico Carlo Disegni, Spino d'Adda (IT); Marcella Carissimi, Treviolo (IT); Cesare Torti, Pavia (IT); Davide Manfré, Pandino (IT)

(73) Assignee: STMicroelectronics International N.V., Geneva (CH)

( * ) Notice: Subject to any disclaimer, the term of this patent is extended or adjusted under 35 U.S.C. 154(b) by 148 days.

(21) Appl. No.: 18/823,332

(22) Filed: Sep. 3, 2024

(65) Prior Publication Data

US 2026/0065987 A1    Mar. 5, 2026

(51) Int. Cl.
    *G11C 11/00*        (2006.01)
    *G11C 13/00*        (2006.01)
    *H03M 1/74*         (2006.01)

(52) U.S. Cl.
    CPC ...... *G11C 13/0069* (2013.01); *G11C 13/0004* (2013.01); *H03M 1/742* (2013.01); *G11C 13/0038* (2013.01)

(58) Field of Classification Search
    CPC ............ G11C 13/0069; G11C 13/0004; G11C 13/0038
    See application file for complete search history.

(56) References Cited

U.S. PATENT DOCUMENTS

| | | | | |
|---|---|---|---|---|
| 6,842,458 B1 * | 1/2005 | Reznic | ................. | H04M 11/062 |
| | | | | 370/463 |
| 8,199,561 B2 * | 6/2012 | Sheu | .................. | G11C 13/0004 |
| | | | | 365/158 |
| 11,374,496 B2 | 6/2022 | Chaput | | |
| 2010/0165711 A1 * | 7/2010 | Lee | .................... | G11C 13/0004 |
| | | | | 365/163 |
| 2014/0084936 A1 | 3/2014 | Pan | | |
| 2015/0340091 A1 | 11/2015 | Zhu | | |
| 2016/0180933 A1 | 6/2016 | Di Vincenzo | | |

(Continued)

FOREIGN PATENT DOCUMENTS

CN           116192133 A      5/2023

OTHER PUBLICATIONS

EP extended European search report, EP Patent Application No. 25196764.2-1211, Jan. 26, 2026, 11 pages.

*Primary Examiner* — Pho M Luu
(74) *Attorney, Agent, or Firm* — Slater Matsil, LLP

(57)        ABSTRACT
A circuit, a circuit for generating adaptive SET pulse currents for phase-change memory (PCM) cells is disclosed. The circuit includes a first current digital-to-analog converter (IDAC) and a second IDAC, each IDAC configured to generate a bias current with a programmable profile, the programmable profile comprising a constant current phase at a predefined set current, a first ramping-down phase from the predefined set current to a minimum cutoff current, a second ramping-down phase from the minimum cutoff current to zero, and a zero-current phase, wherein the constant current phase for each IDAC starts in response to the other IDAC starting the second ramping-down phase; and a programming circuit configured to select one of the bias currents from the first IDAC and the second IDAC and generate the adaptive SET pulse currents.

20 Claims, 7 Drawing Sheets

300

306

(56)          References Cited

U.S. PATENT DOCUMENTS

| | | |
|---|---|---|
| 2019/0355417 A1 | 11/2019 | Lam |
| 2020/0202924 A1 | 6/2020 | Intrater |
| 2020/0273505 A1 | 8/2020 | Jien |
| 2022/0301638 A1 | 9/2022 | Piccardi |
| 2022/0367000 A1 | 11/2022 | Guo |
| 2024/0429928 A1 | 12/2024 | Maccarrone |

* cited by examiner

100

RESET

SET

200

PROGRAMMING FOR NON-VOLATILE MEMORY

TECHNICAL FIELD

The present disclosure generally relates to electronic memory and, in particular embodiments, to programming non-volatile memory.

BACKGROUND

Phase-Change-Memory (PCM) is a type of non-volatile memory that stores information by using the physical change in phase of a chalcogenide glass material. The chalcogenide glass can exist in two different states: an amorphous state, which has high electrical resistance, and a crystalline state, which has low electrical resistance. These two states correspond to the binary values 0 and 1 and thus can be used to store digital information.

Switching states in PCM devices is scalable, potentially allowing for higher densities than conventional memory types, like DRAM or flash. PCM devices can have faster write times and better endurance than flash memory. Additionally, since PCM is non-volatile, the data does not disappear when the power is turned off, which makes PCM an attractive option for applications that require a combination of speed, endurance, and non-volatility.

To write data to a PCM cell, an electrical current is applied to the material to heat it. If the material is heated at a high temperature and then cooled, it becomes amorphous and represents a "0." If, however, it is heated to a temperature between the crystallization and melting points and maintained at that temperature for a sufficient time before cooling, it crystallizes, representing a "1." Reading the data from a PCM cell involves applying a voltage to measure the cell's electrical resistance. The resistance will indicate whether the cell is in the amorphous (high resistance) or crystalline (low resistance) state, thus allowing the device to read the stored information.

SUMMARY

Technical advantages are generally achieved by embodiments of this disclosure, which describe programming non-volatile memory.

A first aspect relates to a circuit for generating adaptive SET pulse currents for phase-change memory (PCM) cells. The circuit includes a first current digital-to-analog converter (IDAC) and a second IDAC, each IDAC configured to generate a bias current with a programmable profile, the programmable profile comprising a constant current phase at a predefined set current, a first ramping-down phase from the predefined set current to a minimum cutoff current, a second ramping-down phase from the minimum cutoff current to zero, and a zero-current phase, wherein the constant current phase for each IDAC starts in response to the other IDAC starting the second ramping-down phase; and a programming circuit configured to select one of the bias currents from the first IDAC and the second IDAC and generate the adaptive SET pulse currents.

A second aspect relates to a circuit for generating adaptive SET pulse currents for phase-change memory (PCM) cells, the circuit comprising a first subcircuit configured to generate a fixed current; a second subcircuit configured to generate a continuously adjustable fixed current; a third subcircuit configured to generate a dynamically adjustable current; and a pair of current digital-to-analog converters (IDACs), each IDAC comprising: a plurality of first transistors controlled by the fixed current, a second transistor controlled by the continuously adjustable fixed current, a third transistor controlled by the dynamically adjustable current, a plurality of fourth transistors, each coupled to one of the first transistors, second transistor, and third transistor and controlled by an associated enable signal, a common summing node coupled to a drain terminal of each fourth transistor, a diode-connected transistor configured to generate a bias current with a programmable profile based on a summed current at the common summing node, and a current mirror configured to replicate the summed current at the common summing node at a drain terminal of the diode-connected transistor.

A third aspect relates to a digital-to-analog converter (IDAC), comprising a plurality of first transistors controlled by a fixed current; second transistor controlled by a continuously adjustable fixed current; a third transistor controlled by a dynamically adjustable current; a plurality of fourth transistors, each coupled to one of the first transistors, second transistor, and third transistor and controlled by an associated enable signal; a common summing node coupled to a drain terminal of each fourth transistor; a diode-connected transistor configured to generate a bias current with a programmable profile based on a summed current at the common summing node; and a current mirror configured to replicate the summed current at the common summing node at a drain terminal of the diode-connected transistor.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
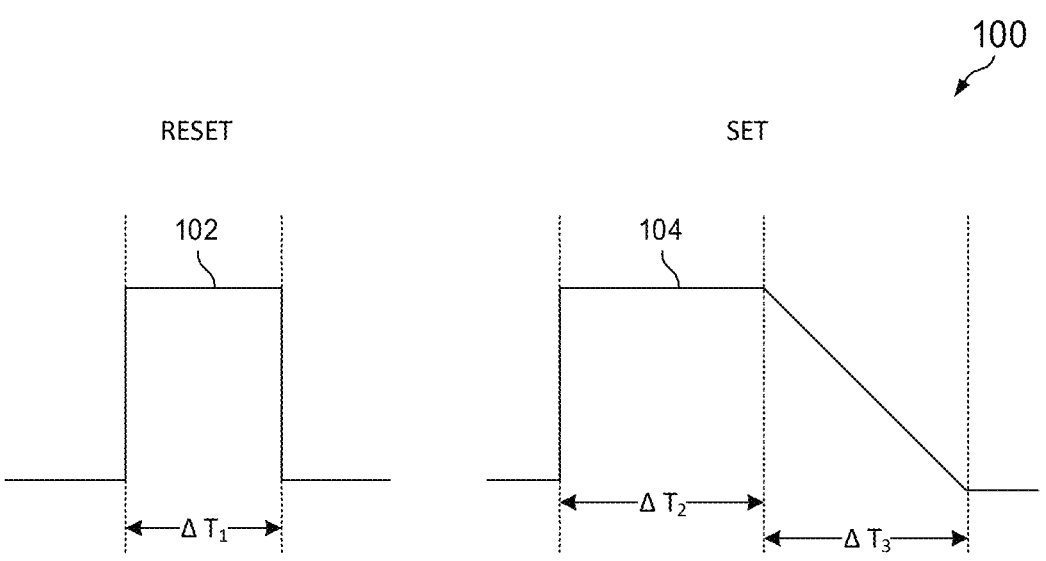
FIG. 1 illustrates timing diagrams for RESET and SET pulses for programming a PCM cell.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

While the inventive aspects are described primarily in the context of a phase-change memory (PCM), it should also be appreciated that these inventive aspects may also apply to other types of non-volatile memory. In particular, aspects of this disclosure may similarly apply to resistive non-volatile memory technologies that store information using variations in electrical resistance. Examples of resistive non-volatile memory technology are PCM, resistive random-access memory (ReRAM or RRAM), and magneto-resistive random-access memory (MRAM). Select transistors are employed to access and manipulate individual memory cells within these technologies, with options including metal-oxide-semiconductor field-effect transistors (MOSFETs), bipolar junction transistors (BJTs), and diodes.

Extending and optimizing the PCM cell write time (i.e., write throughput) while adhering to a maximum current limit sourced from the supply voltage is advantageous when programming PCM cells.

Aspects of the disclosure provide provisioning of program loads to be controlled by a corresponding IDAC. The IDACs are engaged following a specific delay, timed to meet the maximum current programming operation requirements. As soon as the current level is sufficient to support another pulse, a second group of PCM cells is activated before the completion of programming for the first group of PCM cells, allowing for concurrent programming activity and eliminating unnecessary wait times.

By exploiting the maximum current available, write times are shortened, and the speed of the write algorithm is enhanced. This approach is particularly useful for technology nodes presenting higher Word Line (WL) resistance. It ensures that write throughput is improved while operating within the bounds of a limited maximum current yet benefitting from a higher average current.

Accordingly, embodiments of this disclosure speed up the programming throughput for write operations in PCM cells. The SET pulse, characterized by a slow decrease in current, typically has the most significant impact on the cumulative time required by the write algorithm. The embodiments disclosed take advantage of the maximum current output during write operations by utilizing available current more efficiently when the pulse profile indicates a decline in current. Following this, another pulse can be instantaneously given to a subsequent group of cells slated for programming.

An internal microcontroller meticulously orchestrates the sequence of these operational steps. It oversees the activation of pulses and ensures optimal utilization of the current capabilities to streamline the programming process and reduce overall write time. These and additional details are detailed below.

FIG. 1 illustrates timing diagrams 100 for RESET and SET pulses for programming a PCM cell. In PCM technology, the data within the array is programmed through a write algorithm that delivers an electric current to the PCM cells, which causes a phase change in the material within the PCM cells. After applying the programming pulse to the PCM cell, the PCM cell has two possible final states: RESET or SET.

The profile of the bias current supplied during the programming determines each cell's final state. The profile is defined by its current level, shape, and duration. A RESET pulse 102, which typically lasts around 100 nanoseconds (e.g., $\Delta T_1=100$ ns), contrasts with the SET pulse 104, which can extend over several microseconds (e.g., $\Delta T_2+\Delta T_3=400$ ns) and operates at a current level of hundreds of microamperes. The RESET pulse 102 has a box shape—a pulse with consistent amplitude throughout the pulse duration ($\Delta T_1$). Conversely, the SET pulse 104 has a trapezoidal profile. The different shapes of the RESET pulse 102 and the SET pulse 104 are due to the underlying physical mechanisms involved in changing the state of the phase-change material and the considerations for ensuring data reliability and memory device longevity.

The RESET operation aims to rapidly heat the phase-change material to a high temperature and then cool it, causing it to become amorphous and highly resistive, representing a "0." The box shape of the RESET pulse 102 provides a high, consistent current amplitude over a short period. The sudden jolt of energy ensures that the material reaches the melting point quickly and does not have time to recrystallize before cooling. The uniformity of the RESET pulse 102 ensures sufficient energy is delivered to completely melt the material without unnecessarily extending the pulse duration ($\Delta T_1$), which would waste energy and potentially stress the material over time.

In contrast, for the SET operation, which turns the PCM cell to a crystalline, low-resistance state representing a "1," the phase-change material is heated to just below its melting point and maintained at that temperature long enough to induce crystallization. The trapezoidal shape of the SET pulse 104 facilitates this more controlled heating and cooling process.

During the SET operation, an initial higher current heats the material to the required crystallization temperature at an initial duration ($\Delta T_2$). The current gradually decreases according to the trapezoidal profile until it reaches a minimum cutoff value ($I_{cutoff}$), allowing for a controlled cooling that helps ensure complete crystallization during a subsequent duration ($\Delta T_3$). This shape helps avoid overshooting the temperature, which might cause partial melting and an incomplete crystalline state, affecting data reliability. Further, the controlled decrease in current during the SET operation assists in energy conservation. It minimizes thermal stress on the cell and surrounding material, contributing to better endurance of the memory device over many write cycles. The trapezoidal shape thus balances setting the memory state with high precision and maintaining the memory cell's integrity and performance over its lifespan.

In PCM programming that incorporates direct and complementary cell configurations, each bit is encoded using a pair of PCM cells, dictating that whenever a write operation occurs, both cells must undergo a specific pulsing protocol—a RESET or a SET operation. For instance, to commit a logical "0," the procedure consists of resetting the direct cell, switching it to a high-resistance state, and setting the complementary cell to a low-resistance state. Conversely, encoding a logical "1" would entail setting the direct cell to its low-resistance state and resetting the complementary cell to high-resistance.

This dual-cell strategy enhances reliability and enables error checking within the device. If the operation aims to encode a "0," the initial step typically involves sending a SET pulse 104 to alter the resistance of the complementary cell, followed by a RESET pulse 102 to the direct cell. To encode a "1," the initial step involves sending a RESET pulse to the complementary cell and a SET pulse 104 to the direct cell.

Figure 2:
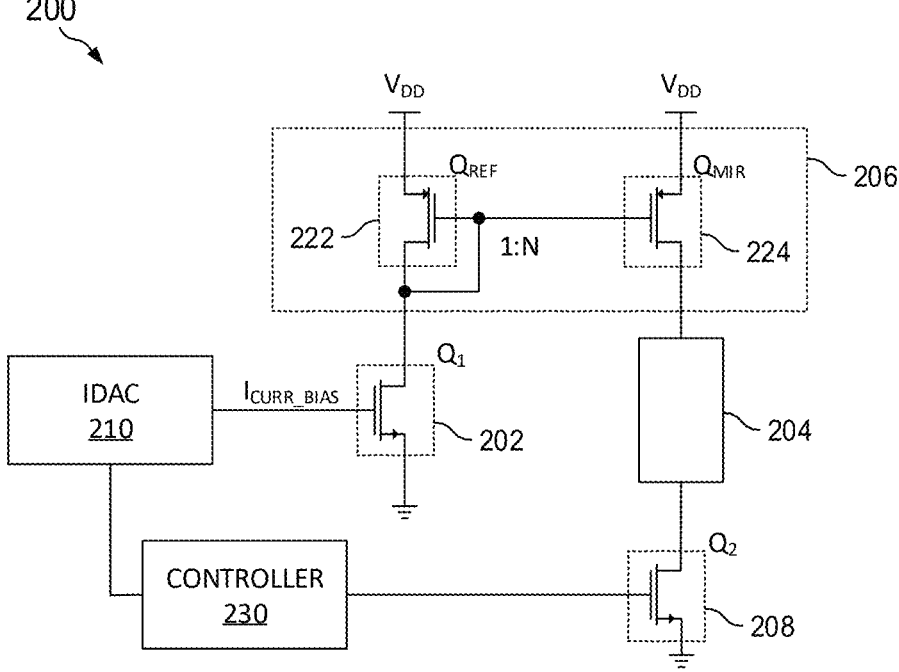
FIG. 2 is a simplified schematic of an embodiment circuit for programming PCM cells.

FIG. 2 illustrates a simplified schematic of an embodiment circuit 200 for programming PCM cells. Circuit 200 includes a transistor ($Q_1$) 202, a PCM cell 204, a current mirror 206, a select transistor ($Q_2$) 208, a current digital-to-analog converter (IDAC) 210, and a controller 230. In embodiments, controller 230 is implemented using a finite state machine (FSM).

In embodiments, the transistor ($Q_1$) 202 and the select transistor ($Q_2$) 208 are n-channel transistors. In embodiments, the transistor ($Q_1$) 202 and the select transistor ($Q_2$) 208 are n-channel metal-oxide-semiconductor field effect transistors (MOSFETs).

To precisely control the current levels to program the PCM cell 204 into a SET state or a RESET state, a bias current ($I_{CURR\_BIAS}$) is provided to the gate terminal of the transistor ($Q_1$) 202 by IDAC 210. The bias current supplied by IDAC 210 has the shape of the RESET pulse 102 to program the PCM cell 204 in the RESET state. The bias current supplied by the IDAC 210 has the shape of the SET pulse 104 to program the PCM cell 204 in the SET state. In embodiments, the input to the IDAC 210 is coupled to controller 230, which configures the operation of the IDAC 210.

The current mirror 206 includes a reference transistor ($Q_{REF}$) 222 and a mirror transistor ($Q_{MIR}$) 224. In embodiments, the reference transistor ($Q_{REF}$) 222 and the mirror transistor ($Q_{MIR}$) 224 are p-channel transistors. In embodiments, the reference transistor ($Q_{REF}$) 222 and the mirror transistor ($Q_{MIR}$) 224 are p-channel MOSFETS.

The reference transistor ($Q_{REF}$) 222 is arranged in a diode-connected configuration at the reference side of the current mirror 206. The source terminal of the reference transistor ($Q_{REF}$) 222 is coupled to the voltage supply ($V_{DD}$). The drain and gate terminals of the reference transistor ($Q_{REF}$) 222 are coupled to the drain terminal of the transistor ($Q_1$) 202 and the gate terminal of the mirror transistor ($Q_{MIR}$) 224.

The mirror transistor ($Q_{MIR}$) 224 is arranged on the output branch where the mirrored current flows. Its source terminal is coupled to the supply voltage ($V_{DD}$). The drain terminal of the mirror transistor ($Q_{MIR}$) 224 is coupled to the PCM cell 204. The select transistor ($Q_2$) 208 is coupled between the PCM cell 204 and the reference ground.

The bias current ($I_{CURR\_BIAS}$) applied to the gate terminal of the transistor ($Q_1$) 202 sets the current flowing at the reference branch of the current mirror 206. Current mirror 206 is configured to replicate the current flowing in the reference branch at the output branch with a scaling factor. Assuming that the scaling factor (i.e., mirror ratio) of the current mirror 206 is 1:N, for every unit of current that flows through the transistor ($Q_1$) 202 (at the reference side of current mirror 206), N units of current are expected to flow through the PCM cell 204 (at the output side of the current mirror 206)—N being a value greater or equal to one. The mirror ratio can be set by adjusting the relative sizes (or geometry) of the reference transistor ($Q_{REF}$) 222 and the mirror transistor ($Q_{MIR}$) 224.

The select transistor ($Q_2$) 208 is configured to control whether or not the PCM cell 204 is selected for programming. In response to the PCM cell 204 being selected for programming, the select transistor ($Q_2$) 208 is turned ON, allowing the programming current to flow through the PCM cell 204.

In embodiments, a pair of transistors (not shown) is arranged between the mirror transistor ($Q_{MIR}$) 224 and PCM cell 204 as a column decoder. The transistors select one specific column (i.e., bit line) with the memory matrix for a read or write operation. The operation of the column decoder in memory cells is well-known, and a detailed description is not provided herein.

Figure 3:
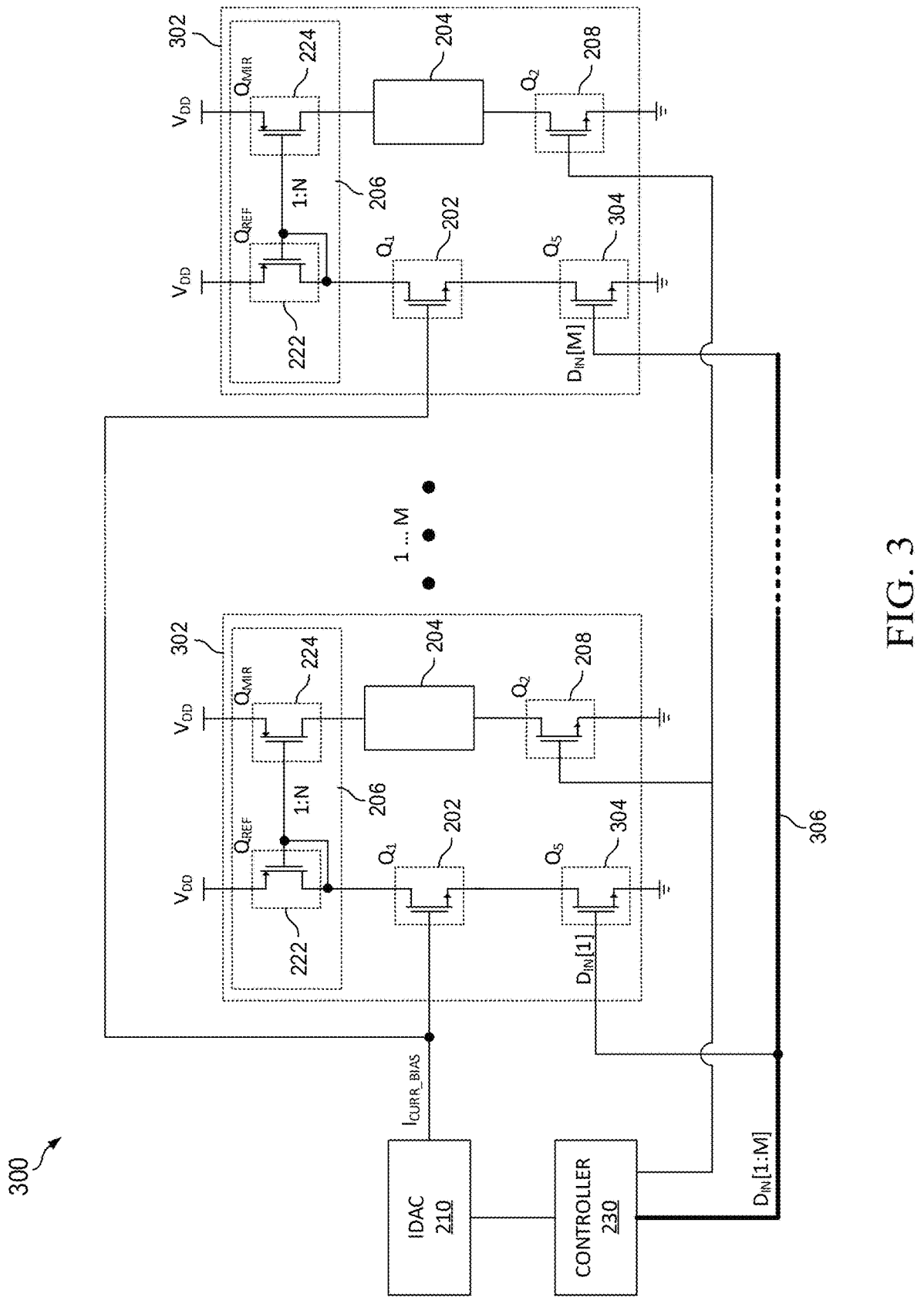
FIG. 3 is a simplified schematic of an embodiment circuit for simultaneously programming multiple PCM cells with an IDAC.

FIG. 3 illustrates a simplified schematic of an embodiment circuit 300 for simultaneously programming multiple PCM cells with the IDAC 210. Circuit 300 includes the IDAC 210, M number of the circuit 302, a bus 306, and controller 230, which may (or may not) be arranged as shown.

As shown, IDAC 210 provides a common bias current bias current ($I_{CURR\_BIAS}$) to each circuit 302. Circuit 302 is similar in structure and function to circuit 200. However, circuit 302 additionally includes a fifth transistor ($Q_5$) 304 coupled between the reference ground and transistor ($Q_1$) 202. In embodiments, the fifth transistor ($Q_5$) 304 is an n-channel transistor. In embodiments, the fifth transistor ($Q_5$) 304 is an n-channel MOSFET.

At each circuit 302, the gate terminal of the fifth transistor ($Q_5$) 304 receives a unique signal (DIN) through, for example, bus 306 that selectively turns the associated transistor ($Q_5$) 304 into the ON state or the OFF state. By selectively setting the fifth transistor ($Q_5$) 304 in each circuit 302 to either the ON or OFF state, the associated PCM cell 204 within each circuit 302 can be individually programmed with the common bias current ($I_{CURR\_BIAS}$) generated by IDAC 210.

In embodiments, the selection signal (DIN) is provided through bus 306 that specifies which PCM cell 204 across circuit 300 will be simultaneously programmed-SET or RESET-based on the applied programming pulse. In embodiments, the selection signal (DIN) is generated by the controller 230.

The maximum current capacity provided by the supply voltage ($V_{DD}$) can constrain the programming of multiple PCM cells with the common bias current ($I_{CURR\_BIAS}$). In embodiments, the supply voltage ($V_{DD}$) is supplied through an internal charge pump or an external supply.

The maximum current available and the specific level required for a given pulse, whether to SET or RESET the PCM cell 204, generally dictates the maximum number of PCM cells that can be programmed simultaneously (i.e., in parallel).

For example, the maximum number of PCM cells that can be simultaneously RESET ($N_{cell\_reset}$) is represented by:

$$N_{cell\_reset} = \frac{I_{max}}{I_{reset}},$$

where $I_{max}$ is the maximum current supplied by the supply voltage ($V_{DD}$) and $I_{Reset}$ is the requisite current to RESET the PCM cell 204. Similarly, the maximum number of PCM cells that can be simultaneously SET ($N_{cell\_set}$) is represented by:

$$N_{cell\_set} = \frac{I_{max}}{I_{set}},$$

where $I_{set}$ is the requisite current to SET the PCM cell 204.

Write time (Write$_{time}$) is a further consideration as it is contingent upon the size of the word ($N_{bit}$) being written to memory and changes proportionally based on how many PCM cells can be pulsed simultaneously. This relationship can be illustrated by the equation:

$$\text{Write}_{time} = \frac{N_{bit} \times T_{reset}}{N_{cell\_reset}} + \frac{N_{bit} \times T_{set}}{N_{cell\_set}},$$

where $T_{reset}$ and $T_{set}$ are the RESET time and SET time for the PCM cell 204, respectively.

Accordingly, the Write time ($\text{Write}_{time}$) is not only a direct result of the number of bits and the time it takes to SET or RESET a cell but inversely proportional to the number of cells that can be pulsed at any one time.

Existing solutions for programming the PCM cell 204 face limitations concerning write times. As discussed above, the write time is influenced by the maximum current supplied during the SET and RESET operations. A notable portion of the write time is attributed to the SET pulse 104, which can take approximately 4 microseconds—a significantly longer duration, typically 40 times the length of the RESET pulse 102, which is around 100 nanoseconds.

The trapezoidal shape of the SET pulse 104 means the current starts higher and decreases gradually until it reaches a minimum cutoff value ($I_{cutoff}$). Accordingly, the total current drawn from the supply during SET pulse 104 assumes a trapezoidal shape, and this shape is proportional to the number of cells being pulsed simultaneously: $N_{cell\_set} \times I_{set}$.

Figure 4:
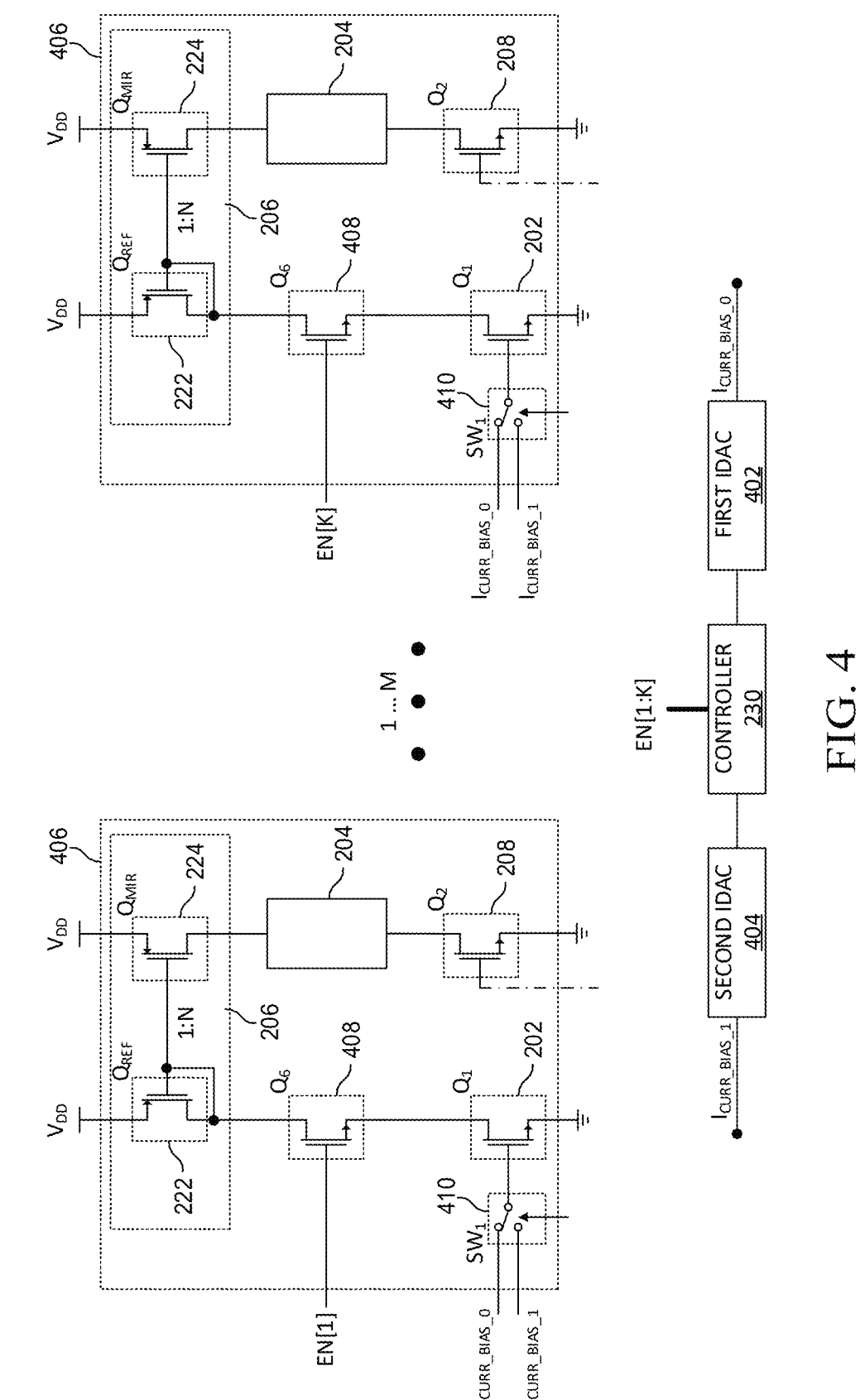
FIG. 4 is a schematic of an embodiment circuit for programming multiple PCM cells.

FIG. 4 illustrates a schematic of an embodiment circuit 400 for programming multiple PCM cells. Circuit 400 includes a first IDAC 402, a second IDAC 404, M number of the circuit 406, a sixth transistor ($Q_6$) 408, and the controller 230, which may (or may not) be arranged as shown. Circuit 400 may include additional components not shown, such as a controller or an FSM circuit.

The first IDAC 402 is configured to generate a first bias current ($I_{CURR\_BIAS\_0}$), and the second IDAC 404 is configured to generate a second bias current ($I_{CURR\_BIAS\_1}$). In embodiments, an FSM circuit provides the input to the first IDAC 402 and the second IDAC 404. In embodiments, controller 230 controls the operation of the first IDAC 402 and the second IDAC 404.

Circuit 406 is similar in structure and function to the circuit 200. In embodiments, circuit 406 includes a switch 410 and the sixth transistor ($Q_6$) 408. In embodiments, the sixth transistor ($Q_6$) 408 is an n-channel transistor. In embodiments, the sixth transistor ($Q_6$) 408 is an n-channel MOSFET.

Switch 410 is configured to switch the signal received at the gate terminal of the transistor ($Q_1$) 202 between the first bias current ($I_{CURR\_BIAS\_0}$) provided by the first IDAC 402 and the second bias current ($I_{CURR\_BIAS\_1}$) provided by the second IDAC 404. In embodiments, switch 410 is controllable through a control signal provided by controller 230. By selectively setting the switch 410, the associated PCM cell 204 of each circuit 406 can be individually programmed with either the first or second bias current.

The sixth transistor ($Q_6$) 408 is coupled between the reference transistor ($Q_{REF}$) 222 and the transistor ($Q_1$) 202. The gate terminal of the sixth transistor ($Q_6$) 408 is an enable signal (EN) that selectively enables or disables the individual sixth transistor ($Q_6$) 408 of the circuit 406. The enable signal (EN) allows for separately programming multiple sets of memory cells with the same current bias. In embodiments, the enable signal (EN) is generated by controller 230.

In an example, if M equals 128, a first enable signal (EN[1]) is associated with a first group of thirty-two PCM cells, which receive the first bias current ($I_{CURR\_BIAS\_0}$). A second enable signal (EN[2]) signal is associated with a second group of thirty-two PCM cells, which receive the second bias current ($I_{CURR\_BIAS\_1}$). A third enable signal (EN[3]) is associated with a third group of thirty-two PCM cells, which also receive the first bias current ($I_{CURR\_BIAS\_0}$), but the third enable signal (EN[3]) is disabled when the first enable signal (EN[1]) is enabled, and vice versa. A fourth enable signal (EN[4]) signal is associated with a fourth group of thirty-two PCM cells, which also receive the second bias current ($I_{CURR\_BIAS\_1}$), but the fourth enable signal (EN[4]) is disabled when the second enable signal (EN[2]) is enabled, and vice versa.

In embodiments, the number (K) of enable signals is an integer between 1 and M. K can be selected based on the maximum number of PCM cells that can be simultaneously programmed by the supply voltage ($V_{DD}$) or a charge pump.

Figure 5:
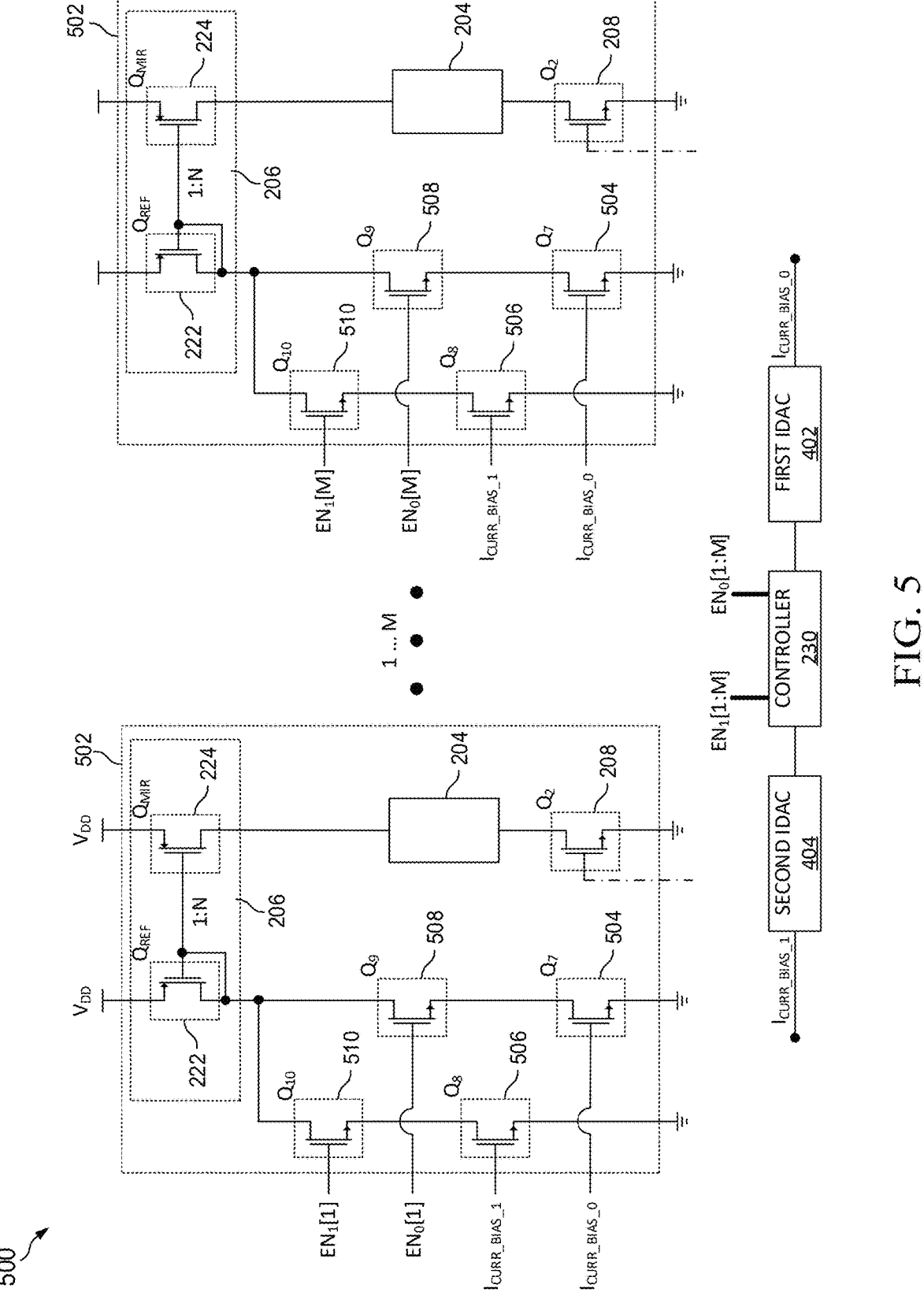
FIG. 5 is a schematic of an embodiment circuit for programming multiple PCM cells.

FIG. 5 illustrates a schematic of an embodiment circuit 500 for programming multiple PCM cells. Circuit 500 includes the first IDAC 402, the second IDAC 404, M number of the circuit 502, a seventh transistor ($Q_7$) 504, an eighth transistor ($Q_8$) 506, a ninth transistor ($Q_9$) 508, a tenth transistor ($Q_{10}$) 510, and the controller 230, which may (or may not) be arranged as shown. Circuit 500 may include additional components not shown, such as a controller or an FSM circuit.

Circuit 502 is similar in structure and function to the circuit 200. However, in place of the transistor ($Q_1$) 202, circuit 502 additionally includes the seventh transistor ($Q_7$) 504, the eighth transistor ($Q_8$) 506, the ninth transistor ($Q_9$) 508, and the tenth transistor ($Q_{10}$) 510. In embodiments, the seventh transistor ($Q_7$) 504, the eighth transistor ($Q_8$) 506, the ninth transistor ($Q_9$) 508, and the tenth transistor ($Q_{10}$) 510 are n-channel transistors. In embodiments, the seventh transistor ($Q_7$) 504, the eighth transistor ($Q_8$) 506, the ninth transistor ($Q_9$) 508, and the tenth transistor ($Q_{10}$) 510 are n-channel MOSFETs.

The gate terminal of the seventh transistor ($Q_7$) 504 is coupled to the first IDAC 402 and configured to receive the first bias current ($I_{CURR\_BIAS\_0}$). The source terminal of the seventh transistor ($Q_7$) 504 is coupled to the reference ground. The drain terminal of the seventh transistor ($Q_7$) 504 is coupled to the source terminal of the ninth transistor ($Q_9$) 508. The ninth transistor ($Q_9$) 508 has a gate terminal configured to receive a first enable signal ($EN_0$).

The gate terminal of the eighth transistor ($Q_8$) 506 is coupled to the second IDAC 404 and configured to receive the second bias current ($I_{CURR\_BIAS\_1}$). The source terminal of the eighth transistor ($Q_8$) 506 is coupled to the reference ground. The drain terminal of the eighth transistor ($Q_8$) 506 is coupled to the source terminal of the tenth transistor ($Q_{10}$) 510. The tenth transistor ($Q_{10}$) 510 has a gate terminal configured to receive a second enable signal ($EN_1$) complementary to the first enable signal ($EN_0$).

The drain terminal of the ninth transistor ($Q_9$) 508 is coupled to the drain terminal of the tenth transistor ($Q_{10}$) 510, coupled to the reference branch of the current mirror 206.

In embodiments, the first enable signal ($EN_0$) and the second enable signal ($EN_1$) are set through a control signal provided by controller 230. The first enable signal ($EN_0$) and the second enable signal ($EN_1$) control which of the first bias current ($I_{CURR\_BIAS\_0}$) or the second bias current ($I_{CURR\_BIAS\_1}$) drives the programming of the PCM cell 204 within circuit 502. By selectively setting the first enable signal ($EN_0$) and the second enable signal ($EN_1$) in circuit 502, the PCM cell 204 within can be individually programmed with either the first or second bias current.

Figure 6:
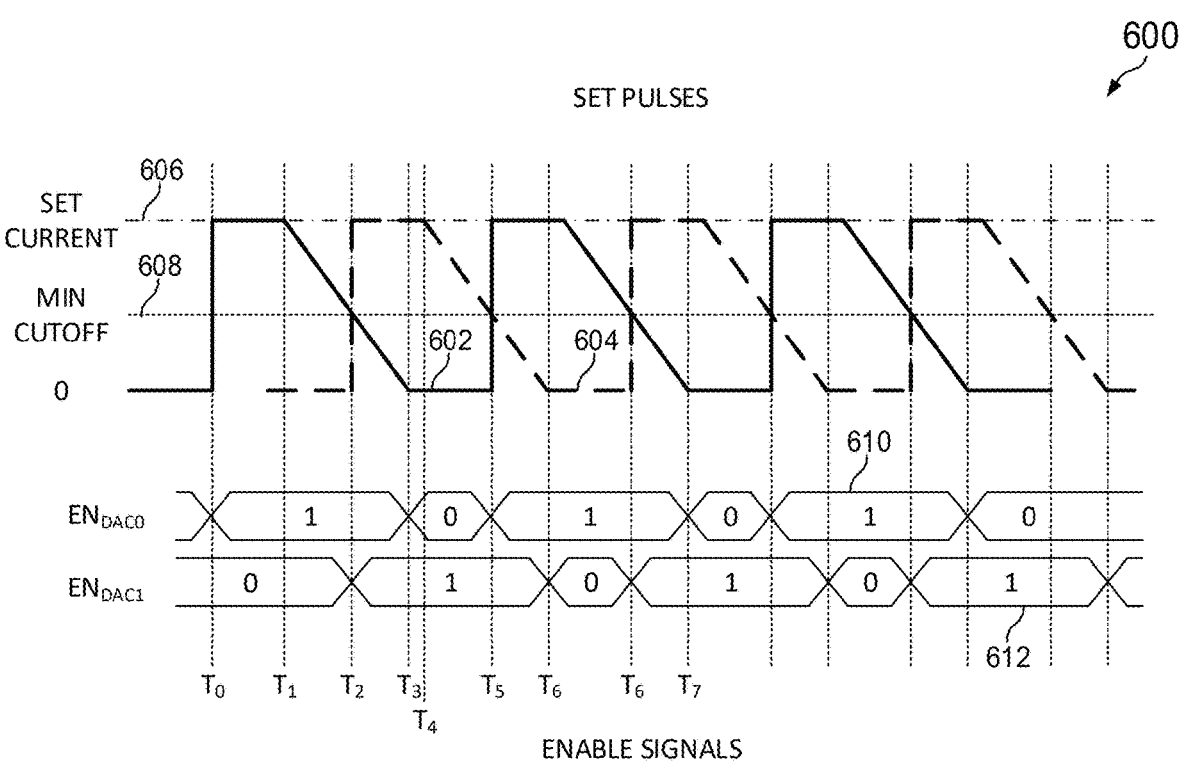
FIG. 6 is a timing diagram for the first bias current and the second bias current provided by, respectively, a first IDAC and a second IDAC during a SET operation.

FIG. 6 illustrates a timing diagram 600 for the first bias current ($I_{CURR\_BIAS\_0}$) 602 (solid line) and the second bias current ($I_{CURR\_BIAS\_1}$) 604 (dashed line) provided by, respectively, the first IDAC 402 and the second IDAC 404 during a SET operation. The timing diagram 600 may be implemented in circuit 400 or circuit 500.

As discussed, the SET pulse 104 during the SET operation for PCM technology is characterized by its trapezoidal shape. FIG. 6 illustrates a synchronized operation of the first IDAC 402 and the second IDAC 404 to simultaneously program multiple PCM cells during a SET operation.

For the first bias current ($I_{CURR\_BIAS\_0}$) 602, the timing profile begins at time $T_0$, increasing from zero to the predefined set current (606). This current level for the first bias current ($I_{CURR\_BIAS\_0}$) 602 is maintained until time $T_1$, at which point it begins to decrease gradually and continues to do so until reaching zero at time $T_3$. At time $T_2$, the current value of the first bias current ($I_{CURR\_BIAS\_0}$) 602 drops to a minimum cutoff value (608) before eventually reaching zero at time $T_3$. The current value of the first bias current ($I_{CURR\_BIAS\_0}$) 602 remains zero until time $T_3$, when the first bias current ($I_{CURR\_BIAS\_0}$) 602 again rises to the predefined set current (606), initiating a new cycle of this process.

For the second bias current ($I_{CURR\_BIAS\_1}$) 604, the output of the second IDAC 404 stays at zero from time $T_0$ until $T_2$. At $T_2$, corresponding to the first bias current ($I_{CURR\_BIAS\_0}$) 602 reaching the minimum cutoff value (608), the output current of the second IDAC 404 increases to the predefined set current (606), a level it holds until time $T_4$. Following this, there is a gradual decrease in current until it zeroes out at time $T_6$. At time $T_5$, the current value of the second bias current ($I_{CURR\_BIAS\_1}$) 604 briefly hits the minimum cutoff value (608) before shutting off at time $T_6$. The second IDAC 404 then sustains a zero-current output until the first bias current ($I_{CURR\_BIAS\_0}$) 602 reaches the minimum cutoff value (608), at this point, the second bias current ($I_{CURR\_BIAS\_1}$) 604 climbs back up to the predefined set current (606). This process, too, repeats in controlled cycles, ensuring a precise and regulated programming of PCM cells.

The repeating of the set pluses for each current bias allows for the simultaneous programming of PCM cells within each group of circuit 400 or circuit 500 at different times. For example, the first SET pulse of the first bias current ($I_{CURR\_BIAS\_0}$) 602 can be provided to a first group of PCM cells simultaneously SET. The second SET pulse of the first bias current ($I_{CURR\_BIAS\_0}$) 602 can be provided to a second group of PCM cells, and so forth. Similarly, repeating the second bias current ($I_{CURR\_BIAS\_1}$) 604 allows for the programming of different groups of PCM cells.

The enable signal ($EN_{DAC0}$) 610 for the first IDAC 402 and the enable signal ($EN_{DAC1}$) 612 for the second IDAC 404 illustrate examples of respective control signals that may be generated by controller 230 to synchronize the operation of the respective IDACs.

Accordingly, the operation of the first IDAC 402 and the second IDAC 404 can be synchronized so that the respective IDACs generate an associated bias current as dictated by the associated enable sign. This coordinated approach allows for two distinct groups of PCM cells to be programmed in succession. The programming of one group occurs promptly after the current bias for the alternate group drops to the minimum cutoff value (608), thereby enabling an efficient and sequential programming process for multiple PCM cell groups.

In embodiments, the current levels can be monitored to synchronize the operation of the IDACs such that the bias current for one IDAC transitions from zero to the predefined set current (606) when the bias current for the other IDAC reaches the minimum cutoff value (608). For example, a current sensor may provide a signal to the controller 230 used to operate each IDAC. Controller 230 may then use the signal to determine when to transition each IDAC from zero to the predefined set current (606) and generate the trapezoidal shape of the SET pulse.

In embodiments, the operation of the IDACs may be based on a specific and predetermined timing process. For example, during the initialization, controller 230 may configure the first IDAC 402 to transition from zero to the predefined set current (606). At the same time, controller 230 may configure the second IDAC 404 to wait until the passing of a duration corresponding to the difference between time $T_2$ and time $T_0$ to transition from the zero current to the predefined set current (606).

Advantageously, by starting the second bias current ($I_{CURR\_BIAS\_1}$) 604 before time $T_3$ (i.e., at Time $T_2$), and starting the first bias current ($I_{CURR\_BIAS\_0}$) 602 before time $T_0$ (i.e., at Time $T_5$), embodiments of this disclosure, shorten the programming time of groups of memory cells. As multiple groups can be programmed similarly through the subsequent set pulses of each bias current, each time improvement (i.e., the difference between times $T_3$ and $T_2$ and the difference between times $T_6$ and $T_5$) is multiplied, resulting in a large time improvement in the programming of PCM cells. Further, the synchronization between the current biases generated by the first IDAC 402 and the second IDAC 404 does not cause any increase in current requirements by the PCM cells for programming.

Accordingly, embodiments of this disclosure advantageously improve PCM cell programming time without increasing the circuits' power requirements. For example, the maximum current supplied by the charge pump to the PCM cells is utilized while significantly shortening the total write time of the PCM cells.

Figure 7:
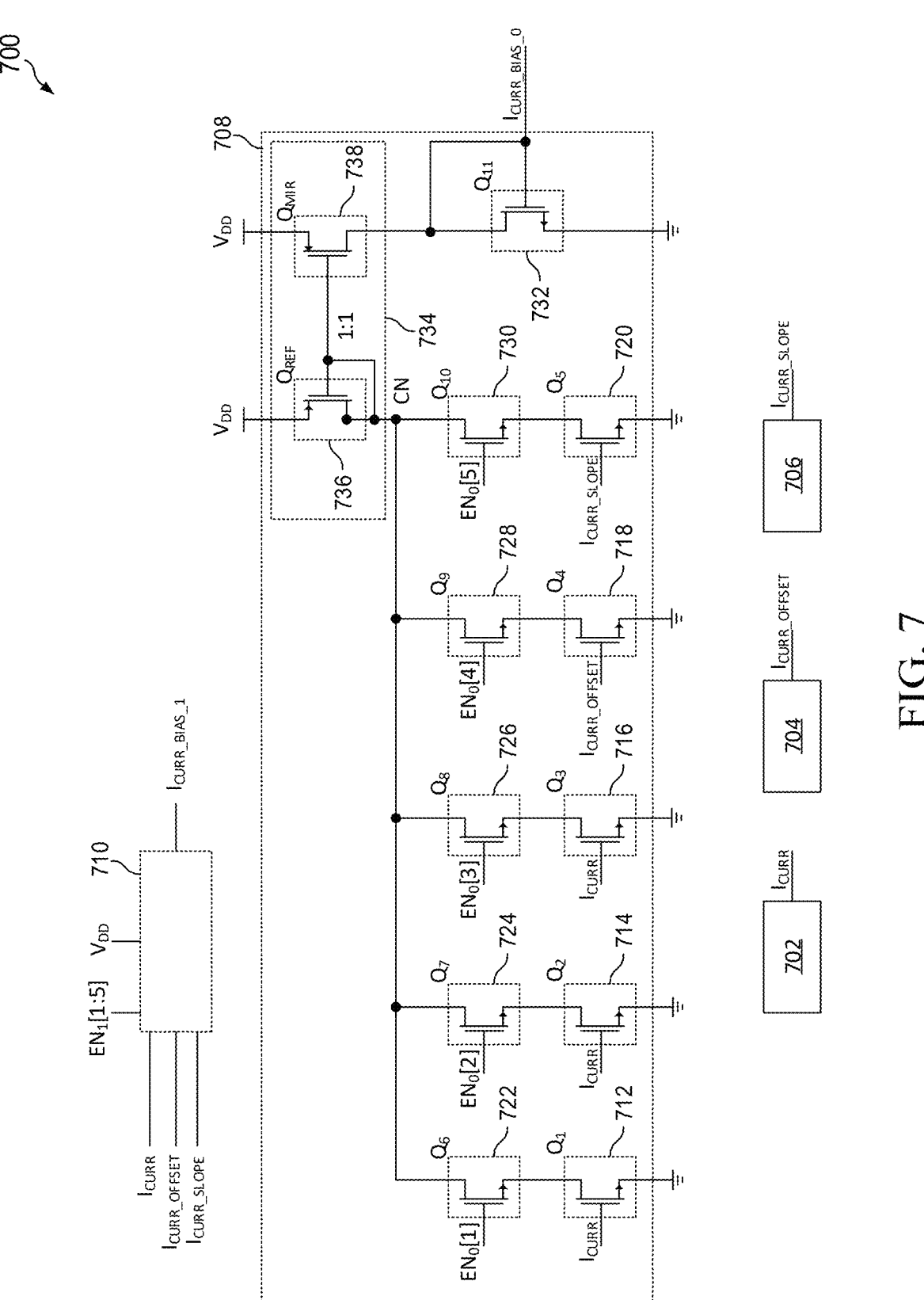
FIG. 7 is a schematic of a modular IDAC circuit.

FIG. 7 illustrates a schematic of a modular IDAC circuit 700. Modular IDAC circuit 700 includes a first subcircuit 702, a second subcircuit 704, a third subcircuit 706, and an intermediary subcircuit 708, and a second intermediary subcircuit 710, which may (or may not) be arranged as shown. Modular IDAC circuit 700 may include additional components that are not shown. In embodiments, the first subcircuit 702, the second subcircuit 704, the third subcircuit 706, the first intermediary subcircuit 708, and the second intermediary subcircuit 710 are coupled to a control circuit, such as the controller 230.

In embodiments, the modular IDAC circuit 700 can replace the dual IDAC operation of the first IDAC 402 and the second IDAC 404, as discussed in FIGS. 4-6. The modular IDAC circuit 700 can simultaneously program multiple PCM cells and groups of PCM cells without increasing current requirements and significantly reducing the total write time. Advantageously, the modular IDAC circuit 700 can reduce circuit footprint compared to the embodiments with two IDACs.

In embodiments, the proposed modular IDAC circuit 700 includes subcircuits 702, 704, and 706, each generating a current output with a different current profile. Combined with the intermediary subcircuits 708 and 710, and circuit 406 and circuit 502, these current outputs can create the current bias in the trapezoidal shape of a SET pulse 104 for PCM cell 204.

Accordingly, by distributing the IDAC operation among the subcircuits 702, 704, and 706, and employing the intermediary subcircuits 708 and 710 between these subcircuits and the groups of PCM cells being written, multiple current biases can be generated using a single IDAC.

The first subcircuit 702 is configured to generate a continuous fixed current ($I_{CURR}$). In embodiments, the fixed current ($I_{CURR}$) is between 7 and 9 microamps (μA). In an embodiment, it is 8 μA. The structure of the first subcircuit 702 is non-limiting, and various configurations can be employed. For example, the first subcircuit 702 can include a current mirror alongside a reference voltage source.

The second subcircuit 704 is configured to generate a continuous adjustable fixed current ($I_{CURR\_OFFSET}$). In embodiments, the second subcircuit 704 is configured to generate a fixed current ($I_{CURR\_OFFSET}$) between 0 and N μA, where N is greater than zero. In an embodiment, the second subcircuit 704 can generate an output current between 0 and 8 μA inclusive. For example, the second subcircuit 704 can generate a 0 μA, 6 μA, or an 8 μA output current. The structure of the second subcircuit 704 is non-limiting, and various configurations can be employed. For example, the second subcircuit 704 can include a digitally controlled potentiometer or a digital-to-analog converter (DAC) in combination with a current mirror. In embodiments, controller 230 generates a digital signal that the second subcircuit 704 receives and, in response, sets the adjustable fixed current ($I_{CURR\_OFFSET}$) at its output at a corresponding value that falls within its operating range.

The third subcircuit 706, like the second subcircuit 704, is configured to generate an adjustable current ($I_{CURR\_SLOPE}$) between 0 and N μA, where N is greater than zero. Further, the third subcircuit 706 can generate a linearly downward ramp current to form the shape of the SET pulse 104. In an embodiment, the third subcircuit 706 can generate and maintain an output current between 0 and 8 μA inclusive. For example, the third subcircuit 706 can generate a 0 μA, 6 μA, or an 8 μA output current. As another example, the third subcircuit 706 can generate a downward ramp current from 8 to 0 μA within a set period.

The structure of the third subcircuit 706 is non-limiting, and various configurations can be employed. For example, the third subcircuit 706 can include a digitally controlled potentiometer or a digital-to-analog converter (DAC) in combination with a current mirror. In embodiments, controller 230 generates a digital signal that the third subcircuit 706 receives and, in response, sets the adjustable current ($I_{CURR\_SLOPE}$) at its output at a corresponding value that falls within its operating range.

As another example, the third subcircuit 706 can include an operational amplifier configured as an integrator, a reset mechanism using a comparator, and a transistor for current conversion. In embodiments, controller 230 generates a digital signal that the third subcircuit 706 receives and, in response, gradually decreases the adjustable current ($I_{CURR\_SLOPE}$) at its output to zero within a set duration. In embodiments, the set duration of the linearly downward ramping output current ($I_{CURR\_SLOPE}$) is set based on the set current, the duration of the ramping down of the SET pulse 104, and the number of subcircuits of the modular IDAC circuit 700.

The first intermediary subcircuit 708 and the second intermediary subcircuit 710 include a first transistor ($Q_1$) 712, a second transistor ($Q_2$) 714, a third transistor ($Q_3$) 716, a fourth transistor ($Q_4$) 718, a fifth transistor ($Q_5$) 720, a sixth transistor ($Q_6$) 722, a seventh transistor ($Q_7$) 724, an eighth transistor ($Q_8$) 726, a ninth transistor ($Q_9$) 728, a tenth transistor ($Q_{10}$) 730, an eleventh transistor ($Q_1$) 732, and a current mirror 734, which may (or may not) be arranged as shown.

In embodiments, the first transistor ($Q_1$) 712, the second transistor ($Q_2$) 714, the third transistor ($Q_3$) 716, the fourth transistor ($Q_4$) 718, the fifth transistor ($Q_5$) 720, the sixth transistor ($Q_6$) 722, the seventh transistor ($Q_7$) 724, the eighth transistor ($Q_8$) 726, the ninth transistor ($Q_9$) 728, and the tenth transistor ($Q_{10}$) 730 are n-channel transistors. In embodiments, the first transistor ($Q_1$) 712, the second transistor ($Q_2$) 714, the third transistor ($Q_3$) 716, the fourth transistor ($Q_4$) 718, the fifth transistor ($Q_5$) 720, the sixth transistor ($Q_6$) 722, the seventh transistor ($Q_7$) 724, the eighth transistor ($Q_8$) 726, the ninth transistor ($Q_9$) 728, and the tenth transistor ($Q_{10}$) 730 are n-channel MOSFETs.

The current mirror 734 includes a reference transistor ($Q_{REF}$) 736 and a mirror transistor ($Q_{MIR}$) 738 in a 1:1 ratio. The reference transistor ($Q_{REF}$) 736 is configured in a diode-connected configuration and arranged on the reference branch of the current mirror 734. The mirror transistor ($Q_{MIR}$) 738 is arranged on the output branch of the current mirror 734. In embodiments, the reference transistor ($Q_{REF}$) 736 and the mirror transistor ($Q_{MIR}$) 738 are p-channel transistors. In embodiments, the reference transistor ($Q_{REF}$) 736 and the mirror transistor ($Q_{MIR}$) 738 are p-channel MOSFETs.

The source terminals of the first transistor ($Q_1$) 712, the second transistor ($Q_2$) 714, the third transistor ($Q_3$) 716, the fourth transistor ($Q_4$) 718, the fifth transistor ($Q_5$) 720, and the eleventh transistor ($Q_{11}$) 732 are coupled to reference ground.

The drain terminals of the sixth transistor ($Q_6$) 722, the seventh transistor ($Q_7$) 724, the eighth transistor ($Q_8$) 726, the ninth transistor ($Q_9$) 728, and the tenth transistor ($Q_{10}$) 730 are coupled to a common node (CN).

The drain terminals of the first transistor ($Q_1$) 712, the second transistor ($Q_2$) 714, the third transistor ($Q_3$) 716, the fourth transistor ($Q_4$) 718, and the fifth transistor ($Q_5$) 720 are, respectively, coupled to the source terminals of the sixth transistor ($Q_6$) 722, the seventh transistor ($Q_7$) 724, the eighth transistor ($Q_8$) 726, the ninth transistor ($Q_9$) 728, and the tenth transistor ($Q_{10}$) 730.

The gate terminals of the sixth transistor ($Q_6$) 722, the seventh transistor ($Q_7$) 724, the eighth transistor ($Q_8$) 726, the ninth transistor ($Q_9$) 728, and the tenth transistor ($Q_{10}$) 730 are coupled to a control circuit, such as controller 230. The control circuit provides an enable signal to each of the gate terminals of the sixth transistor ($Q_6$) 722, the seventh transistor ($Q_7$) 724, the eighth transistor ($Q_8$) 726, the ninth transistor ($Q_9$) 728, and the tenth transistor ($Q_{10}$) 730 to selectively enable or disable the associated transistor.

By selectively enabling or disabling the associated transistors of the intermediary subcircuits 708 and 710, the current bias (e.g., first bias current ($I_{CURR\_BIAS\_0}$) or second bias current ($I_{CURR\_BIAS\_1}$)) generated at the outputs of the modular IDAC circuit 700 (i.e., at the gate terminals of the eleventh transistor ($Q_{11}$) 732 of intermediary subcircuits 708 and 710) provides a SET pulse current for programming a PCM cell 204 through circuit 406 or circuit 502.

The gate terminals of the first transistor ($Q_1$) 712, the second transistor ($Q_2$) 714, and the third transistor ($Q_3$) 716 are coupled to the output of the first subcircuit 702. The gate terminal of the fourth transistor ($Q_4$) 718 is coupled to the output of the second subcircuit 704. The gate terminal of the fifth transistor ($Q_5$) 720 is coupled to the output of the third subcircuit 706.

The source terminals of the reference transistor ($Q_{REF}$) 736 and the mirror transistor ($Q_{MIR}$) 738 are coupled to the supply voltage ($V_{DD}$). In embodiments, the voltage at the supply voltage ($V_{DD}$) equals 5 V. The gate terminals of the reference transistor ($Q_{REF}$) 736 and the mirror transistor ($Q_{MIR}$) 738 are coupled to the common node (CN). Additionally, the drain terminal of the reference transistor ($Q_{REF}$) 736 is coupled to the common node (CN).

The eleventh transistor ($Q_{11}$) 732 is arranged as a diode-connected transistor (i.e., the drain terminal of the eleventh transistor ($Q_{11}$) 732 is coupled to its gate terminal). The drain terminal of the mirror transistor ($Q_{MIR}$) 738 is coupled to the drain terminal of the eleventh transistor ($Q_{11}$) 732.

The second intermediary subcircuit 710 has a structure and components similar to the first intermediary subcircuit 708, which has not been shown in detail for brevity of discussion. A difference between the two intermediary subcircuits is that the first intermediary subcircuit 708 receives the first enable signal $EN_0$, whereas the second intermediary subcircuit 710 receives the second enable signal $EN_1$.

Figure 8:
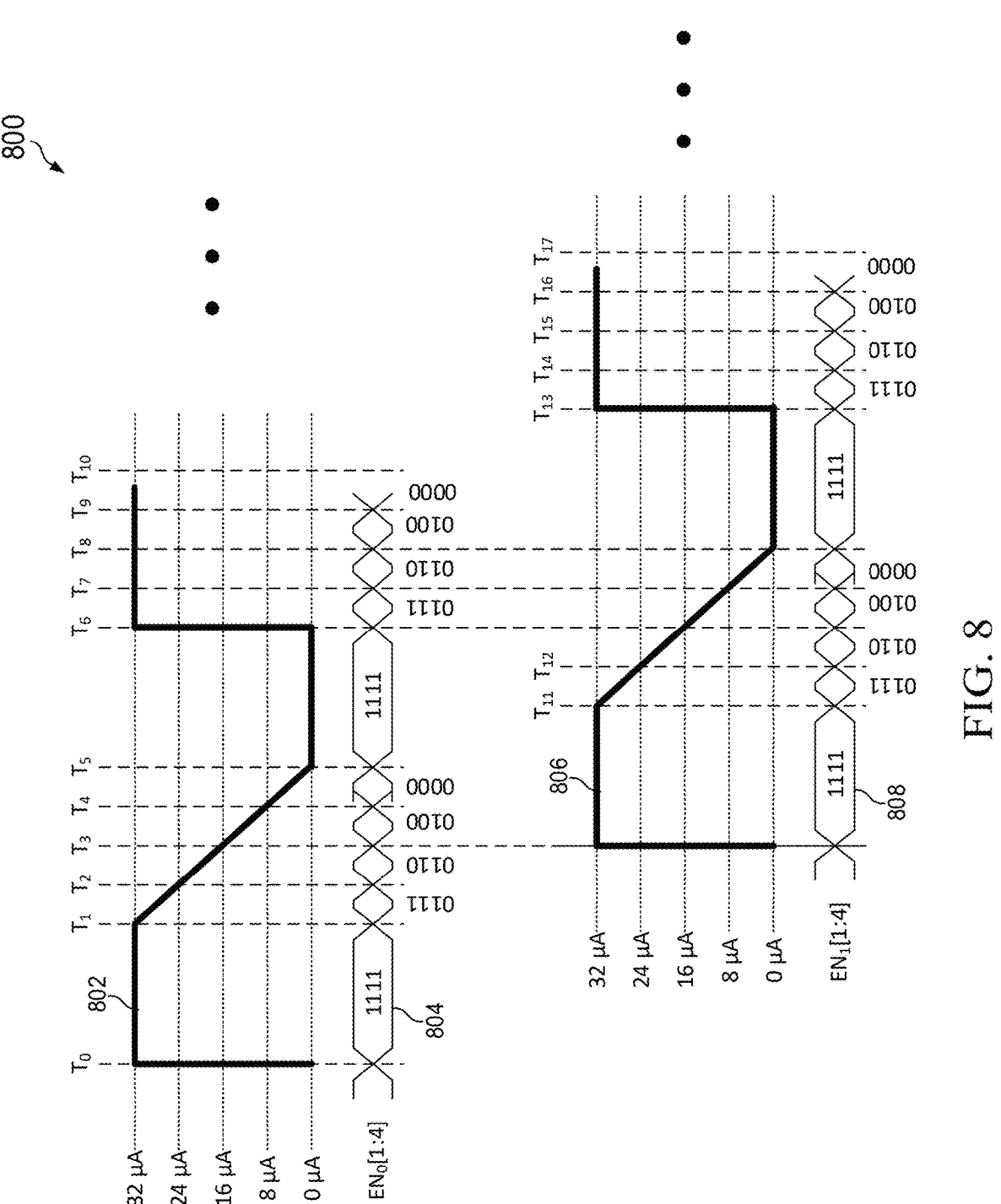
FIG. 8 is a detailed diagram of an embodiment bias current generated by a modular IDAC circuit.

FIG. 8 illustrates a detailed diagram of an embodiment bias current 800 generated by the modular IDAC circuit 700, which is used to discuss its operation.

The SET pulse 802 can be either the first bias current ($I_{CURR\_BIAS\_0}$) or the second bias current ($I_{CURR\_BIAS\_1}$) at the outputs of the first intermediary subcircuit 708 or the second intermediary subcircuit 710, respectively. The pre-defined set current of 32 μA for the SET pulse 802 is non-limiting and is used only for illustration purposes—a predefined set current with a different value is contemplated in other embodiments.

Moreover, the first bias current ($I_{CURR\_BIAS\_0}$) or the second bias current ($I_{CURR\_BIAS\_1}$) provided to the reference branch of the current mirror 206 of circuit 400 or circuit 500 is multiplied by the ratio of the mirror current. For example, if the ratio of the current mirror 206 of circuits 400 or circuit 500 is 1:10 and the predefined set current of the first bias current ($I_{CURR\_BIAS\_0}$) or the second bias current ($I_{CURR\_BIAS\_1}$) is 32 μA, the associated predefined set current at the PCM cell 204 is 320 μA.

In embodiments where the associated predefined set current at the PCM cell 204 is a value between, for example, 240 and 320 μA, the controller 230 provides a control signal to the second subcircuit 704 to reduce the adjustable fixed current ($I_{CURR\_OFFSET}$). For example, if the predefined set current is 300 μA, the adjustable fixed current ($I_{CURR\_OFFSET}$) is set to 6 μA. Or, if the predefined set current is 280 μA, the adjustable fixed current ($I_{CURR\_OFFSET}$) is set to 4 μA.

Regarding the first intermediary subcircuit 708, SET pulse 802 increases from 0 to the predefined set current of, for example, 32 μA at time $T_0$ and remains at the predefined set current until time $T_1$. From time $T_0$ until time $T_1$, to generate the 32 μA by the modular IDAC circuit 700, the enable signals $EN_0[1:4]$ to the gate terminals of the sixth transistor ($Q_6$) 722, the seventh transistor ($Q_7$) 724, the eighth transistor ($Q_8$) 726, and the ninth transistor ($Q_9$) 728 of the first intermediary subcircuit 708 are asserted to turn on the transistors (i.e., $EN_0[1:4]$ equals "1111"). In embodiments, the enable signals $EN_0[1:4]$ are generated by the controller 230.

From time $T_0$ until time $T_1$, the $EN_0[5]$ at the gate terminal of the tenth transistor ($Q_{10}$) 730 is de-asserted. The fixed current ($I_{CURR}$) provides 8 μA. The adjustable fixed current ($I_{CURR\_OFFSET}$) is set to its maximum value of, for example, 8 μA. The current at the reference branch of the current mirror 730 equals 32 μA from time $T_0$ until time $T_1$. Accordingly, from time $T_0$ until time $T_1$, the current value of the first bias current ($I_{CURR\_BIAS\_0}$) equals 32 μA.

At time $T_1$, controller 230 sets the enable signals $EN_0[1:4]$ to "0111," which turns ON the seventh transistor ($Q_7$) 724, the eighth transistor ($Q_8$) 726, and the ninth transistor ($Q_9$)

728, while de-asserting the sixth transistor ($Q_6$) 722 of the first intermediary subcircuit 708. Controller 230 asserts the enable signal $EN_0[5]$ to generate an adjustable current ($I_{CURR\_SLOPE}$) with a sawtooth waveform that linearly decreases from 8 μA at time $T_1$ to 0 μA at time $T_2$. Accordingly, the current value of the first bias current ($I_{CURR\_BIAS\_0}$) linearly decreases from 32 μA at time $T_1$ to 24 μA at time $T_2$.

At time $T_2$, controller 230 sets the enable signals $EN_0[1:4]$ to "0110," which turns ON the seventh transistor ($Q_7$) 724 and the eighth transistor ($Q_8$) 726, while de-asserting the sixth transistor ($Q_6$) 722 and the ninth transistor ($Q_9$) 728 of the first intermediary subcircuit 708. Accordingly, the adjustable fixed current ($I_{CURR\_OFFSET}$) and one instance of the fixed current ($I_{CURR}$) are removed from the reference branch of the current mirror 730. Controller 230 asserts the enable signal $EN_0[5]$ to generate an adjustable current ($I_{CURR\_SLOPE}$) with a sawtooth waveform that linearly decreases from 8 μA at time $T_2$ to 0 μA at time $T_3$. Accordingly, the current value of the first bias current ($I_{CURR\_BIAS\_0}$) linearly decreases from 24 μA at time $T_2$ to 16 μA at time $T_3$.

At time $T_3$, controller 230 sets the enable signals $EN_0[1:4]$ to "0100," which turns ON the seventh transistor ($Q_7$) 724 while de-asserting the sixth transistor ($Q_6$) 722, the eighth transistor ($Q_8$) 726, and the ninth transistor ($Q_9$) 728 of the first intermediary subcircuit 708. Accordingly, the adjustable fixed current ($I_{CURR\_OFFSET}$) and two instances of the fixed current ($I_{CURR}$) are removed from the reference branch of the current mirror 730. Controller 230 asserts the enable signal $EN_0[5]$ to generate an adjustable current ($I_{CURR\_SLOPE}$) with a sawtooth waveform that linearly decreases from 8 μA at time $T_3$ to 0 μA at time $T_4$. Accordingly, the current value of the first bias current ($I_{CURR\_BIAS\_0}$) linearly decreases from 16 μA at time $T_3$ to 8 μA at time $T_4$.

At time $T_4$, controller 230 sets the enable signals $EN_0[1:4]$ to "0000," which de-asserts the sixth transistor ($Q_6$) 722, the seventh transistor ($Q_7$) 724, the eighth transistor ($Q_8$) 726, and the ninth transistor ($Q_9$) 728 of the first intermediary subcircuit 708. Accordingly, the adjustable fixed current ($I_{CURR\_OFFSET}$) and three instances of the fixed current ($I_{CURR}$) are removed from the reference branch of the current mirror 730. Controller 230 asserts the enable signal $EN_0[5]$ to generate an adjustable current ($I_{CURR\_SLOPE}$) with a sawtooth waveform that linearly decreases from 8 μA at time $T_4$ to 0 μA at time $T_5$. Accordingly, the current value of the first bias current ($I_{CURR\_BIAS\_0}$) linearly decreases from 8 μA at time $T_4$ to 0 μA at time $T_5$.

The enable signals $EN_0[1:4]$ 804 are the enable signals for the sixth transistor ($Q_6$) 722, the seventh transistor ($Q_7$) 724, the eighth transistor ($Q_8$) 726, and the ninth transistor ($Q_9$) 728 of first intermediary subcircuit 708—the enable signal $EN_0[5]$ for the tenth transistor ($Q_{10}$) 730 is varied by the controller 230 to create the ramp down for the adjustable current ($I_{CURR\_SLOPE}$).

In embodiments, the process is repeated to generate the first bias current ($I_{CURR\_BIAS\_0}$) from time $T_0$ for a subsequent group of PCM cells 204.

Regarding the second intermediary subcircuit 710, SET pulse 806 increases from 0 to the predefined set current of, for example, 32 μA at time $T_3$ and remains at the predefined set current until time $T_{11}$. The time $T_3$ corresponds to the first bias current ($I_{CURR\_BIAS\_0}$) reaching the minimum cutoff value ($I_{cutoff}$) of 16 μA.

From time $T_3$ until time Tu, to generate the 32 μA by the modular IDAC circuit 700, the enable signals $EN_1[1:4]$ to the gate terminals of the sixth transistor ($Q_6$) 722, the seventh transistor ($Q_7$) 724, the eighth transistor ($Q_8$) 726, and the ninth transistor ($Q_9$) 728 of the second intermediary subcircuit 710 are asserted to turn on the transistors (i.e., $EN_1[1:4]$ equals "1111"). In embodiments, the enable signals $EN_1[1:4]$ are generated by the controller 230.

From time $T_3$ until time $T_1$, the enable signal $EN_1[5]$ at the gate terminal of the tenth transistor ($Q_{10}$) 730 is de-asserted. The fixed current ($I_{CURR}$) provides 8 μA. The adjustable fixed current ($I_{CURR\_OFFSET}$) is set to its maximum value of, for example, 8 μA. The current at the reference branch of the current mirror 730 equals 32 μA from time $T_0$ until time $T_1$. Accordingly, from time $T_0$ until time $T_1$, the current value of the first bias current ($I_{CURR\_BIAS\_0}$) equals 32 μA.

At time $T_1$, controller 230 sets the enable signals $EN_1[1:4]$ to "0111," which turns ON the seventh transistor ($Q_7$) 724, the eighth transistor ($Q_8$) 726, and the ninth transistor ($Q_9$) 728, while de-asserting the sixth transistor ($Q_6$) 722 of the second intermediary subcircuit 710. Controller 230 asserts the enable signal $EN_1[5]$ to generate an adjustable current ($I_{CURR\_SLOPE}$) with a sawtooth waveform that linearly decreases from 8 μA at time $T_{11}$ to 0 μA at time $T_{12}$. Accordingly, the current value of the second bias current ($I_{CURR\_BIAS\_1}$) linearly decreases from 32 μA at time $T_{11}$ to 24 μA at time $T_{12}$.

At time $T_{12}$, controller 230 sets the enable signals $EN[1:4]$ to "0110," which turns ON the seventh transistor ($Q_7$) 724 and the eighth transistor ($Q_8$) 726, while de-asserting the sixth transistor ($Q_6$) 722 and the ninth transistor ($Q_9$) 728 of the second intermediary subcircuit 710. Accordingly, the adjustable fixed current ($I_{CURR\_OFFSET}$) and one instance of the fixed current ($I_{CURR}$) are removed from the reference branch of the current mirror 730. Controller 230 asserts the enable signal $EN_1[5]$ to generate an adjustable current ($I_{CURR\_SLOPE}$) with a sawtooth waveform that linearly decreases from 8 μA at time $T_{12}$ to 0 μA at time $T_0$. Accordingly, the current value of the second bias current ($I_{CURR\_BIAS\_1}$) linearly decreases from 24 μA at time $T_{12}$ to 16 μA at time $T_6$.

At time $T_6$, controller 230 sets the enable signals $EN[1:4]$ to "0100," which turns ON the seventh transistor ($Q_7$) 724 while de-asserting the sixth transistor ($Q_6$) 722, the eighth transistor ($Q_8$) 726, and the ninth transistor ($Q_9$) 728 of the second intermediary subcircuit 710. Accordingly, the adjustable fixed current ($I_{CURR\_OFFSET}$) and two instances of the fixed current ($I_{CURR}$) are removed from the reference branch of the current mirror 730. Controller 230 asserts the enable signal $EN_1[5]$ to generate an adjustable current ($I_{CURR\_SLOPE}$) with a sawtooth waveform that linearly decreases from 8 μA at time $T_0$ to 0 μA at time $T_7$. Accordingly, the current value of the second bias current ($I_{CURR\_BIAS\_1}$) linearly decreases from 16 μA at time $T_6$ to 8 μA at time $T_7$.

At time $T_7$, controller 230 sets the enable signals $EN[1:4]$ to "0000," which de-asserts the sixth transistor ($Q_6$) 722, the seventh transistor ($Q_7$) 724, the eighth transistor ($Q_8$) 726, and the ninth transistor ($Q_9$) 728 of the second intermediary subcircuit 710. Accordingly, the adjustable fixed current ($I_{CURR\_OFFSET}$) and three instances of the fixed current ($I_{CURR}$) are removed from the reference branch of the current mirror 730. Controller 230 asserts the enable signal $EN_1[5]$ to generate an adjustable current ($I_{CURR\_SLOPE}$) with a sawtooth waveform that linearly decreases from 8 μA at time $T_7$ to 0 μA at time $T_8$. Accordingly, the current value of the second bias current ($I_{CURR\_BIAS\_1}$) linearly decreases from 8 μA at time $T_7$ to 0 μA at time $T_8$.

The enable signals $EN_1[1:4]$ 808 are the enable signals for the sixth transistor ($Q_6$) 722, the seventh transistor ($Q_7$) 724, the eighth transistor ($Q_8$) 726, and the ninth transistor ($Q_9$) 728 of second intermediary subcircuit 710—the enable signal $EN[5]$ for the tenth transistor ($Q_{10}$) 730 is varied by the controller 230 to create the ramp down for the adjustable current ($I_{CURR\_SLOPE}$).

In embodiments, the process is repeated to generate the second bias current ($I_{CURR\_BIAS\_1}$) from time $T_{13}$ for a subsequent group of PCM cells 204.

It should be appreciated that in embodiments where the predetermined set current 606 is greater than 320 μA to program a PCM cell 204, the modular IDAC circuit 700 can be expanded by, for example, adding additional transistors to provide multipliers of the fixed current ($I_{CURR}$) to reach the additional current level.

It is noted that all steps outlined in the flow charts of the method are not necessarily required and can be optional. Further, changes to the arrangement of the steps, removal of one or more steps and path connections, and addition of steps and path connections are similarly contemplated.

A first aspect relates to a circuit for generating adaptive SET pulse currents for phase-change memory (PCM) cells. The circuit includes a first current digital-to-analog converter (IDAC) and a second IDAC, each IDAC configured to generate a bias current with a programmable profile, the programmable profile comprising a constant current phase at a predefined set current, a first ramping-down phase from the predefined set current to a minimum cutoff current, a second ramping-down phase from the minimum cutoff current to zero, and a zero-current phase, wherein the constant current phase for each IDAC starts in response to the other IDAC starting the second ramping-down phase; and a programming circuit configured to select one of the bias currents from the first IDAC and the second IDAC and generate the adaptive SET pulse currents.

In a first implementation form of the circuit, according to the first aspect, the programming circuit is configured to current scale the selected bias current based on a predetermined multiplier to generate a scaled bias current; and apply the scaled bias current to a subset of the PCM cells.

In a second implementation form of the circuit according to the first aspect as such or any preceding implementation form of the first aspect, the programming circuit is configured to generate a first SET pulse current for programming a first PCM cell and a second SET pulse current for programming a second PCM cell.

In a third implementation form of the circuit according to the first aspect as such or any preceding implementation form of the first aspect, the programming circuit is configured to generate a first SET pulse current and a second SET pulse current with overlapping non-zero current values during a time interval. The overlapping non-zero current values enable simultaneous programming of a first plurality of PCM cells and a second plurality of PCM cells.

In a fourth implementation form of the circuit according to the first aspect as such or any preceding implementation form of the first aspect, a sum of the overlapping non-zero current values equals a maximum current value provided by a charge pump configured for writing to PCM cells.

In a fifth implementation form of the circuit according to the first aspect as such or any preceding implementation form of the first aspect, the programming circuit comprises a plurality of switches configured to select the bias current from the first IDAC and the second IDAC; and a current mirror configured to current scale the selected bias current based on a predetermined multiplier to generate a scaled bias current.

In a sixth implementation form of the circuit according to the first aspect as such or any preceding implementation form of the first aspect, the circuit further includes a controller coupled to the first IDAC, the second IDAC, and the programming circuit, the controller configured to control a timing of a first SET pulse current for programming a first PCM cell and a second SET pulse current for programming a second PCM cell.

A second aspect relates to a circuit for generating adaptive SET pulse currents for phase-change memory (PCM) cells, the circuit comprising a first subcircuit configured to generate a fixed current; a second subcircuit configured to generate a continuously adjustable fixed current; a third subcircuit configured to generate a dynamically adjustable current; and a pair of current digital-to-analog converters (IDACs), each IDAC comprising: a plurality of first transistors controlled by the fixed current, a second transistor controlled by the continuously adjustable fixed current, a third transistor controlled by the dynamically adjustable current, a plurality of fourth transistors, each coupled to one of the first transistors, second transistor, and third transistor and controlled by an associated enable signal, a common summing node coupled to a drain terminal of each fourth transistor, a diode-connected transistor configured to generate a bias current with a programmable profile based on a summed current at the common summing node, and a current mirror configured to replicate the summed current at the common summing node at a drain terminal of the diode-connected transistor.

In a first implementation form of the circuit, according to the second aspect, the circuit includes a programming circuit configured to select a bias current from each IDAC and generate the adaptive SET pulse currents.

In a second implementation form of the circuit according to the second aspect as such or any preceding implementation form of the second aspect, the programming circuit is configured to current scale the selected bias current based on a predetermined multiplier to generate a scaled bias current; and apply the scaled bias current to a subset of the PCM cells.

In a third implementation form of the circuit according to the second aspect as such or any preceding implementation form of the second aspect, the programming circuit is configured to generate a first SET pulse current for programming a first PCM cell and a second SET pulse current for programming a second PCM cell.

In a fourth implementation form of the circuit according to the second aspect as such or any preceding implementation form of the second aspect, the programming circuit is configured to generate a first SET pulse current and a second SET pulse current with overlapping non-zero current values during a time interval. The overlapping non-zero current values enable simultaneous programming of a first plurality of PCM cells and a second plurality of PCM cells.

In a fifth implementation form of the circuit according to the second aspect as such or any preceding implementation form of the second aspect, the circuit further includes a controller configured to generate the enable signals to produce a desired current profile; selectively enable the third transistor; and coordinate an operation of each IDAC to generate the first SET pulse current and the second SET pulse current with the overlapping non-zero current values.

In a sixth implementation form of the circuit according to the second aspect as such or any preceding implementation form of the second aspect, the programmable profile includes a constant current phase at a predefined set current, a first ramping-down phase from the predefined set current to a minimum cutoff current, a second ramping-down phase from the minimum cutoff current to zero, and a zero-current phase, wherein the constant current phase for each IDAC starts in response to the other IDAC starting the second ramping-down phase.

In a seventh implementation form of the circuit according to the second aspect as such or any preceding implementation form of the second aspect, the dynamically adjustable current is a linearly downward ramping current.

A third aspect relates to a digital-to-analog converter (IDAC), comprising a plurality of first transistors controlled by a fixed current; second transistor controlled by a continuously adjustable fixed current; a third transistor controlled by a dynamically adjustable current; a plurality of fourth transistors, each coupled to one of the first transistors, second transistor, and third transistor and controlled by an associated enable signal; a common summing node coupled to a drain terminal of each fourth transistor; a diode-connected transistor configured to generate a bias current with a programmable profile based on a summed current at the common summing node; and a current mirror configured to replicate the summed current at the common summing node at a drain terminal of the diode-connected transistor.

In a first implementation form of the IDAC, according to the third aspect, the IDAC is couplable to a controller configured to generate the enable signals to coordinate an operation of the IDAC for generating the bias current.

In a second implementation form of the IDAC according to the third aspect as such or any preceding implementation form of the third aspect, the programmable profile comprises a constant current phase at a predefined set current, a first ramping-down phase from the predefined set current to a minimum cutoff current, a second ramping-down phase from the minimum cutoff current to zero, and a zero-current phase.

In a third implementation form of the IDAC according to the third aspect as such or any preceding implementation form of the third aspect, the IDAC is couplable to a programming circuit configured to receive the bias current and generate an adaptive SET pulse current for phase-change memory (PCM) cells based on the bias current.

In a fourth implementation form of the IDAC according to the third aspect as such or any preceding implementation form of the third aspect, the IDAC further includes a plurality of fifth transistors controlled by the fixed current; a sixth transistor controlled by the continuously adjustable fixed current; a seventh transistor controlled by the dynamically adjustable current; a plurality of eighth transistors, each coupled to one of the fifth transistors, sixth transistor, and seventh transistor and controlled by an associated second enable signal; a second common summing node coupled to a drain terminal of each eighth transistor; a second diode-connected transistor configured to generate a second bias current with the programmable profile based on a second summed current at the second common summing node; and a second current mirror configured to replicate the second summed current at the second common summing node at a drain terminal of the second diode-connected transistor.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A circuit for generating adaptive SET pulse currents for phase-change memory (PCM) cells, the circuit comprising:
   a first current digital-to-analog converter (IDAC) and a second IDAC, each IDAC configured to generate a bias current with a programmable profile, the programmable profile comprising:
      a constant current phase at a predefined set current,
      a first ramping-down phase from the predefined set current to a minimum cutoff current,
      a second ramping-down phase from the minimum cutoff current to zero, and
      a zero-current phase, wherein the constant current phase for each IDAC starts in response to the other IDAC starting the second ramping-down phase; and
   a programming circuit configured to select one of the bias currents from the first IDAC and the second IDAC and generate the adaptive SET pulse currents.

2. The circuit of claim 1, wherein the programming circuit is configured to:
   current scale the selected bias current based on a predetermined multiplier to generate a scaled bias current; and
   apply the scaled bias current to a subset of the PCM cells.

3. The circuit of claim 1, wherein the programming circuit is configured to generate a first SET pulse current for programming a first PCM cell and a second SET pulse current for programming a second PCM cell.

4. The circuit of claim 1, wherein the programming circuit is configured to generate a first SET pulse current and a second SET pulse current with overlapping non-zero current values during a time interval, and wherein the overlapping non-zero current values enable simultaneous programming of a first plurality of PCM cells and a second plurality of PCM cells.

5. The circuit of claim 4, wherein a sum of the overlapping non-zero current values equals a maximum current value provided by a charge pump configured for writing to PCM cells.

6. The circuit of claim 1, wherein the programming circuit comprises:
   a plurality of switches configured to select the bias current from the first IDAC and the second IDAC; and
   a current mirror configured to current scale the selected bias current based on a predetermined multiplier to generate a scaled bias current.

7. The circuit of claim 1, further comprising a controller coupled to the first IDAC, the second IDAC, and the programming circuit, the controller configured to control a timing of a first SET pulse current for programming a first PCM cell and a second SET pulse current for programming a second PCM cell.

8. A circuit for generating adaptive SET pulse currents for phase-change memory (PCM) cells, the circuit comprising:
   a first subcircuit configured to generate a fixed current;
   a second subcircuit configured to generate a continuously adjustable fixed current;
   a third subcircuit configured to generate a dynamically adjustable current; and
   a pair of current digital-to-analog converters (IDACs), each IDAC comprising:
      a plurality of first transistors controlled by the fixed current,
      a second transistor controlled by the continuously adjustable fixed current,
      a third transistor controlled by the dynamically adjustable current,
      a plurality of fourth transistors, each coupled to one of the first transistors, second transistor, and third transistor and controlled by an associated enable signal,
      a common summing node coupled to a drain terminal of each fourth transistor,
      a diode-connected transistor configured to generate a bias current with a programmable profile based on a summed current at the common summing node, and
      a current mirror configured to replicate the summed current at the common summing node at a drain terminal of the diode-connected transistor.

9. The circuit of claim 8, further comprising a programming circuit configured to select a bias current from each IDAC and generate the adaptive SET pulse currents.

10. The circuit of claim 9, wherein the programming circuit is configured to:
   current scale the selected bias current based on a predetermined multiplier to generate a scaled bias current; and
   apply the scaled bias current to a subset of the PCM cells.

11. The circuit of claim 9, wherein the programming circuit is configured to generate a first SET pulse current for programming a first PCM cell and a second SET pulse current for programming a second PCM cell.

12. The circuit of claim 9, wherein the programming circuit is configured to generate a first SET pulse current and a second SET pulse current with overlapping non-zero current values during a time interval, and wherein the overlapping non-zero current values enable simultaneous programming of a first plurality of PCM cells and a second plurality of PCM cells.

13. The circuit of claim 12, further comprising a controller configured to:
   generate the enable signals to produce a desired current profile;
   selectively enable the third transistor; and
   coordinate an operation of each IDAC to generate the first SET pulse current and the second SET pulse current with the overlapping non-zero current values.

14. The circuit of claim 8, wherein the programmable profile comprises:
   a constant current phase at a predefined set current;
   a first ramping-down phase from the predefined set current to a minimum cutoff current;
   a second ramping-down phase from the minimum cutoff current to zero; and
   a zero-current phase, wherein the constant current phase for each IDAC starts in response to the other IDAC starting the second ramping-down phase.

15. The circuit of claim 8, wherein the dynamically adjustable current is a linearly downward ramping current.

16. A digital-to-analog converter (IDAC), comprising:

a plurality of first transistors controlled by a fixed current;

a second transistor controlled by a continuously adjustable fixed current;

a third transistor controlled by a dynamically adjustable current;

a plurality of fourth transistors, each coupled to one of the first transistors, second transistor, and third transistor and controlled by an associated enable signal;

a common summing node coupled to a drain terminal of each fourth transistor;

a diode-connected transistor configured to generate a bias current with a programmable profile based on a summed current at the common summing node; and a current mirror configured to replicate the summed current at the common summing node at a drain terminal of the diode-connected transistor.

17. The IDAC of claim 16, wherein the IDAC is couplable to a controller configured to generate the enable signals to coordinate an operation of the IDAC for generating the bias current.

18. The IDAC of claim 16, wherein the programmable profile comprises:

a constant current phase at a predefined set current;

a first ramping-down phase from the predefined set current to a minimum cutoff current;

a second ramping-down phase from the minimum cutoff current to zero; and a zero-current phase.

19. The IDAC of claim 16, wherein the IDAC is couplable to a programming circuit configured to receive the bias current and generate an adaptive SET pulse current for phase-change memory (PCM) cells based on the bias current.

20. The IDAC of claim 16, further comprising:

a plurality of fifth transistors controlled by the fixed current;

a sixth transistor controlled by the continuously adjustable fixed current;

a seventh transistor controlled by the dynamically adjustable current;

a plurality of eighth transistors, each coupled to one of the fifth transistors, sixth transistor, and seventh transistor and controlled by an associated second enable signal;

a second common summing node coupled to a drain terminal of each eighth transistor;

a second diode-connected transistor configured to generate a second bias current with the programmable profile based on a second summed current at the second common summing node; and a second current mirror configured to replicate the second summed current at the second common summing node at a drain terminal of the second diode-connected transistor.

\*   \*   \*   \*   \*